United States Patent [19]

Fischer

[11] Patent Number: 4,527,184

[45] Date of Patent: Jul. 2, 1985

[54] INTEGRATED SEMICONDUCTOR CIRCUITS WITH CONTACT INTERCONNECT LEVELS COMPRISED OF AN ALUMINUM/SILICON ALLOY

[75] Inventor: Franz Fischer, Munich, Fed. Rep. of Germany

[73] Assignee: Siemens Aktiengesellschaft, Berlin & Munich, Fed. Rep. of Germany

[21] Appl. No.: 530,539

[22] Filed: Sep. 9, 1983

[30] Foreign Application Priority Data

Dec. 1, 1982 [DE] Fed. Rep. of Germany ....... 3244461

[51] Int. Cl.³ ............................................. H01L 23/48
[52] U.S. Cl. ....................................... 357/67; 357/71; 357/65; 428/620; 420/548
[58] Field of Search ............................. 357/67, 71, 65; 428/620; 420/548

[56] References Cited

U.S. PATENT DOCUMENTS 3,609,470  9/1971  Kuiper .................................. 357/67
4,359,486  11/1982  Patalong et al. ...................... 357/65

OTHER PUBLICATIONS

H. Murrmann, "Modern Bipolar Technology for High-Performance ICs", *Siemens Forsch.-u. Entwickl.* (Siemens Research and Development Reports), vol. 5, No. 6, (1976) pp. 353-359.

P. B. Ghate et al., Electromigration Testing of Ti:W/Al and Ti:W/Al-Cu Film Conductors, *Thin Solid Films*, vol. 55, (1978), pp. 113-123.

I. Ames et al., "Reduction of Electromigration in Aluminum Films by Copper Doping", *IBM J. Res. Develop.*, vol. 14, (1970), pp. 461-463.

M. P. Lepselter, "Beam-Lead Technology", *The Bell System Tech. J.*, vol. 45, (1966), pp. 233-253.

*Primary Examiner*—Martin H. Edlow
*Assistant Examiner*—L. Brown
*Attorney, Agent, or Firm*—Hill, Van Santen, Steadman & Simpson

[57] ABSTRACT

Contact interconnect levels for integrated circuit with a semiconductor substrate consisting of silicon in which and on which components forming the circuit are produced, are composed essentially of an aluminum/silicon/titanium alloy having a proportion of about 1 through 2% by weight silicon and a titanium content of less than about 0.5% by weight. The reliability and loadability of electrical interconnects for VLSI systems is increased by utilization of this metallization.

3 Claims, No Drawings 4,527,184

INTEGRATED SEMICONDUCTOR CIRCUITS WITH CONTACT INTERCONNECT LEVELS COMPRISED OF AN ALUMINUM/SILICON ALLOY

BACKGROUND OF THE INVENTION

1. Field of the Invention

The invention relates to integrated circuits and somewhat more particularly to integrated circuits having a semiconductor substrate comprised of silicon in which and on which electrical components defining the circuit are produced and having contact interconnect levels comprised of an aluminum/silicon alloy.

2. Prior Art

Integrated semiconductor circuits with aluminum/silicon interconnect levels having an intermediate layer composed of titanium, which is utilized for attaining thermally similar characteristics (a so-called thermal match) between the conductive metal layer and the silicon oxide in order to increase device reliability and loadability are known. For example, see H. Murrmann, "Modern Bipolar Technology For High Performance ICs", *Siemens Forschung-und Entwicklungsberichten* (Siemens Research and Development Reports), Vol. 5, No. 6, (1976) pages 353–359.

Intermediate layers composed of titanium/tungsten which are also utilized for attaining a thermal match are described by P. B. Ghate and I. C. Blair in *Thin Solid Films*, Vol. 55, (1978) pages 113–123.

It can be derived from a report published by I. Ames, F. d'Heurle and R. Horstmann in *IBM J. Res. Develop.*, Vol. 14, (1970) pages 461–463 that electromigration phenomena of material in aluminum films can reduced by the addition of 4% copper to the aluminum.

Extremely reliable interconnects can be fabricated from gold with intermediate layers composed of titanium and platinum (see M. P. Lepselter, *The Bell System Tech. J.*, Vol. 45, (1966) pages 233–253. It can also be derived from the afore-referenced article that stable, low-resistant contacts between metal and silicon in a contact hole can be attained by utilizing platinum silicide.

However, all of the foregoing metallizations require additional intermediate layers and, thus, additional process steps which cause considerable added expense and which can increase the reject rate during manufacture of integrated circuits.

SUMMARY OF THE INVENTION

The invention provides a means of increasing the reliability and loadability of electrical interconnects for VLSI-systems (VLSI = very large scale integration) without additional and/or cost-intensive measures being required.

By following the principles of the invention, one can achieve increased reliability and loadability of electrical interconnects in a manner different from the known arrangements and achieve a certain simplification and other improvements over known arrangements.

In accordance with the principles of the invention, integrated circuits with a semiconductor substrate comprised of silicon in which and on which electrical components defining the circuit are generated and having at least one contact interconnect level comprised of an alloy/silicon alloy are improved by utilizing an alloy/silicon alloy having a proportion of about 1 through 2% by weight, based on the weight of the aluminum, silicon and a titanium content of less than about 0.5%, by weight, on the same basis.

In a particularly favorable exemplary embodiment, contact interconnect levels are formed of an aluminum/silicon alloy having, with about 1% by weight silicon, about 0.1 through 0.5% titanium therein.

In accordance with the principles of the invention, the aluminum/silicon/titanium alloy forming contact interconnect levels (metallization) in integrated semiconductor circuits is produced by high frequency atomization whereby the alloy components are immediately co-incorporated into the aluminum layer during its deposition on a semiconductor substrate.

DESCRIPTION OF PREFERRED EMBODIMENTS

The invention provides improved integrated circuits with a semiconductor substrate consisting of silicon, in which and on which device components forming the circuit are generated and having at least one contact interconnect level comprised of an aluminum/silicon alloy wherein the improvement comprises in that the aluminum/silicon alloy contains a proportion of about 1 through 2% by weight silicon and a titanium amount of less than about 0.5% by weight, based on the weight of aluminum in the alloy.

In a preferred exemplary embodiment, the titanium content, with a proportion of about 1% by weight silicon in the alloy, amounts to about 0.1 through 0.5% by weight.

At least the following advantages are attained by following the principles of the invention:

1. The thermal similarity (matching) between metal and $SiO_2$ is improved; the adhesion therebetween deteriorates more slowly, even at relatively high electrical loads, than with aluminum/silicon layers.
2. The formation of relatively low-resistant, stable contacts between metal, silicon or polysilicon as well as between tantalum, tungsten, titanium and/or molybdenum silicides is guaranteed, even without an intermediate layer.
3. The oxide layer on the metal (alloy) surface remains relatively dense; accordingly, the metal layer is not susceptible to corrosion.
4. The grain boundary diffusion becomes noticeably smaller; accordingly, the electromigraton of material is thereby also reduced.
5. Titanium exhibits a high grain-refining effect in aluminum and increases the mechanical stability thereof, whereby it becomes more greatly loadable, electrically.
6. The contactability is improved in relation to the amount of titanium in the alloy metallization.
7. In comparison to standard technology, the fabrication of the inventive interconnects or metallizations requires no additional process steps and, thus, no added costs are incured.

The properties of the aluminum/silicon/titanium metallization described above under points 1 through 6, effect an increase in the MFT value (MFT value = mean time to failure) with a stress load by a factor of 30 in comparison to prior art aluminum/silicon metallizations. The reliability of the aluminum/silicon/titanium metallizations or interconnects can therefore be equated with known multi-layer metallizations.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. An integrated circuit comprising a silicon substrate and a contact interconnect level, said interconnect level consisting of an aluminum-silicon-titanium alloy containing between about 1 and 2% silicon, and titanium in an amount of about 0.1 to 0.5% by weight.

2. An integrated circuit as defined in claim 1 wherein said silicon content in said alloy is about 1% by weight.

3. In integrated circuits as defined in claim 1, wherein the aluminum/silicon/titanium alloy is produced by high frequency atomization whereby the alloy components are immediately co-incorporated into the aluminum layer upon deposition.

* * * * *